United States Patent [19]
Davidian

[11] Patent Number: 5,260,909
[45] Date of Patent: Nov. 9, 1993

[54] MEMORY WITH PHASE LOCKED SERIAL INPUT PORT

[75] Inventor: David Davidian, Cambridge, Mass.

[73] Assignee: NEC Electronics Incorporated, Mountain View, Calif.

[21] Appl. No.: 793,979

[22] Filed: Nov. 18, 1991

[51] Int. Cl.5 ............................................. G11C 8/04
[52] U.S. Cl. .............................. 365/233; 365/189.04; 365/189.12
[58] Field of Search ............... 365/233, 189.04, 189.12

[56] References Cited

U.S. PATENT DOCUMENTS

| | | | |
|---|---|---|---|
| 4,558,436 | 12/1985 | Wagensonner et al. | 365/233 X |
| 4,750,839 | 6/1988 | Wang et al. | 365/233 |
| 4,912,679 | 3/1990 | Shinoda et al. | 365/233 X |
| 4,987,559 | 1/1991 | Miyauchi et al. | 365/189.04 |

Primary Examiner—Eugene R. LaRoche
Assistant Examiner—Do Hyun Yoo
Attorney, Agent, or Firm—Skjerven, Morrill, MacPherson, Franklin & Friel

[57] ABSTRACT

A memory circuit is provided with a phase locked serial input port that is adapted to receive unsynchronized raw serial data. The memory eliminates complex serial input timing problems associated with conventional video RAM, and allows direct connection to high speed external storage devices and communication devices. The memory circuit includes a memory array having an input port and an output port, a serial sequential circuit coupled to the memory array for loading data into the memory array, and a phase locked loop circuit for receiving raw serial data. The phase locked loop circuit is coupled to the serial sequential circuit for providing a synchronized data signal and a clock signal to the serial sequential circuit.

5 Claims, 3 Drawing Sheets

MEMORY WITH PHASE LOCKED SERIAL INPUT PORT

BACKGROUND OF THE INVENTION

Field of the Invention

This invention relates to memory systems and more particularly to memory systems with serial input ports.

Description of the Relevant Art

In general, digital memory systems are used for storing data within a memory array and for providing selected data stored within the memory array to an output port. To obtain high-speed performance, memory systems are often specifically adapted to a particular application. For example, video RAM are well-known for receiving clocked serial data at an input port and storing the serial data within a memory array in predetermined memory locations. A video RAM advantageously allows serial data generated from, for example, a video camera, to be stored quickly without the requirements of microprocessor-generated addressing strobes for each byte or block of information.

Although video RAMs are adapted to store serial data in a system where a well-defined clock signal is available, video RAMs cannot directly receive and store raw (unsynchronized) serial data from an external source. For example, if raw serial data is received from an external source over a modem line, the video RAM is not synchronized to receive the raw serial data.

It is therefore desirable to provide a memory system that can receive raw serial data and which can efficiently process and store the data.

SUMMARY OF THE INVENTION

In accordance with the present invention, a memory circuit is provided with a phase locked serial input port that is adapted to receive unsynchronized raw serial data. The memory eliminates complex serial input timing problems associated with conventional video RAM, and allows direct connection to high speed external storage devices and communication devices.

These and other advantages are provided with the present invention, in accordance with which a memory circuit comprises a memory array having a plurality of memory cells and a serial sequential circuit coupled to an input bus of the memory array. The serial sequential circuit includes a clock line and a data line and is adapted to receive serial data at the data line that is synchronized with a clock signal at the clock line. The serial sequential circuit provides data to predetermined ones of the memory cells. The memory circuit according to the invention further comprises a phase locked loop circuit coupled to the serial sequential circuit for receiving unsynchronized serial data at a raw serial data line and for generating the clock signal. The phase locked loop circuit further provides the synchronized serial data to the data line of the serial sequential circuit. The memory circuit finally includes a random access port circuit having an address port and a parallel data port. The random access port circuit is coupled to the memory array for providing data stored in a select one of the memory cells to the parallel output port in response to an addressing signal at the address port.

The invention will be more readily understood by reference to the drawings and the detailed description. As will be appreciated by one skilled in the art, the invention is applicable to memory circuits in general, and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 1:
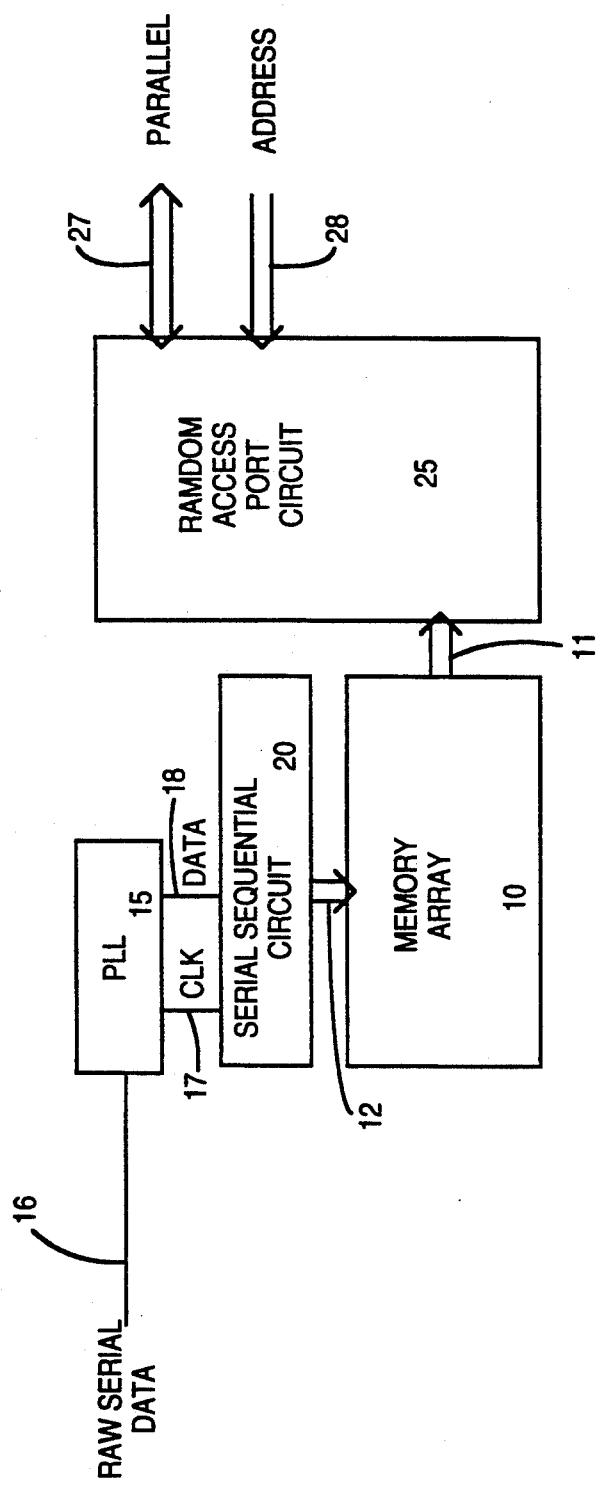
FIG. 1 is a block diagram of a memory with a phase locked serial input port in accordance with the present invention.

Referring to FIG. 1, a block diagram of a memory circuit with a phase locked serial input port is shown in accordance with the present invention. The memory circuit includes a memory array 10 having a parallel input/output bus 11 and a parallel input bus 12. The circuit further includes a phase locked loop circuit 15 having a raw serial data port 16, a clock line 17, and a data line 18. The phase locked loop circuit 15 is coupled at clock line 17 and data line 18 to a serial sequential circuit 20. The memory circuit finally includes a random access port circuit 25 coupled to the parallel input/output bus 11 of the memory array 10 and having a parallel data input/output port 27 and an address port 28.

The random access port circuit 25 is provided with appropriate decoding circuitry to allow the independent access of one or more cells within the memory array 10. The random access port circuit 25 may be similar to the decode and parallel input/output circuitry associated with conventional random access memories. Such a random access port circuit is described below with reference to FIG. 2.

The phase locked loop circuit 15 receives unsynchronized raw serial data at serial port 16 and during normal operation phase-locks to the incoming serial data. Upon locking, a synchronized clock signal is provided at clock line 17 and the associated data is provided at data line 18.

It is noted that a variety of configurations of known phase locked loop circuits may be used. One important consideration to the designer in selecting the particular configuration of phase locked loop circuit 15 is, of course, the frequency locking range and the lock time of the phase locked loop circuit.

The serial sequential circuit 20 receives the clock and data signals from the phase locked loop 15 and provides the data to the memory array 10. The serial sequential circuit 20 has internal memory select logic that receives the serial data at data line 18 and causes the data (either serially or in parallel) to be written into the memory array 10 at predetermined memory locations. The serial sequential circuit 20 may be embodied in a configuration similar to the related circuitry associated with a conventional video RAM system. Such a serial sequential circuit is described below in conjunction with FIG. 3.

Figure 2:
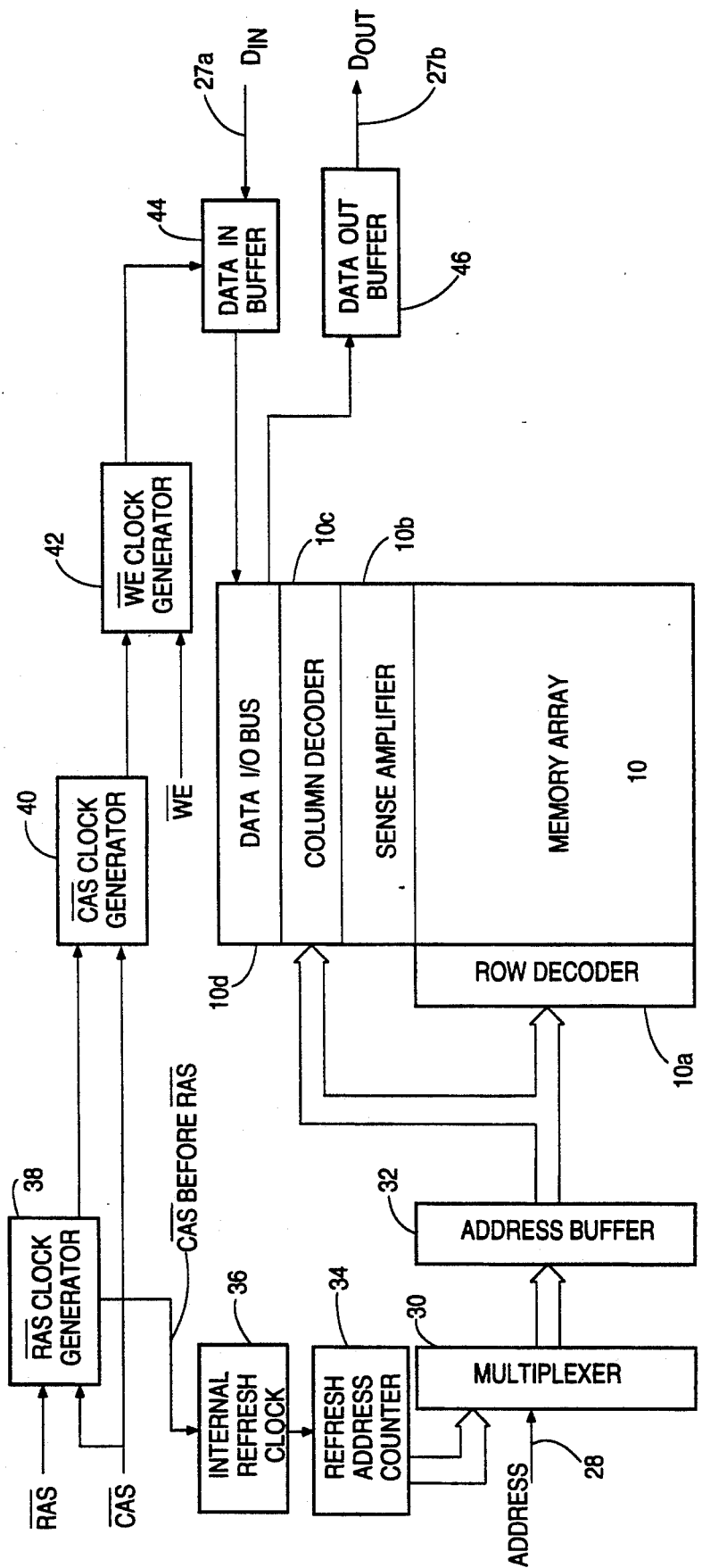
FIG. 2 is a block diagram illustrating a random access port circuit.

Referring next to FIG. 2, a block diagram is shown of a circuit representative of one embodiment of random access port circuit 25. The memory array 10 is shown with an associated row decoder 10a, a sense amplifier 10b, a column decoder 10c, and a data I/O bus 10d. The random access port circuit 25 includes a multiplexer 30, an address buffer 32, a refresh address counter 34, and an internal refresh clock 36. The random access port circuit 25 further includes a $\overline{\text{RAS}}$ clock generator 38, a $\overline{\text{CAS}}$ clock generator 40, and a $\overline{\text{WE}}$ clock generator 42. The random access port circuit 25 finally includes a data-in buffer 44 and a data-out buffer 46. Address signals are provided at address port 28, and input and output data is provided at ports 27a and 27b, respectively. The random access port circuit of FIG. 2 is explained in more detail in the 1989 NEC Memory Products Databook, page 5-54, Artwork No. 83-003235B. This document is incorporated herein by reference.

Figure 3:
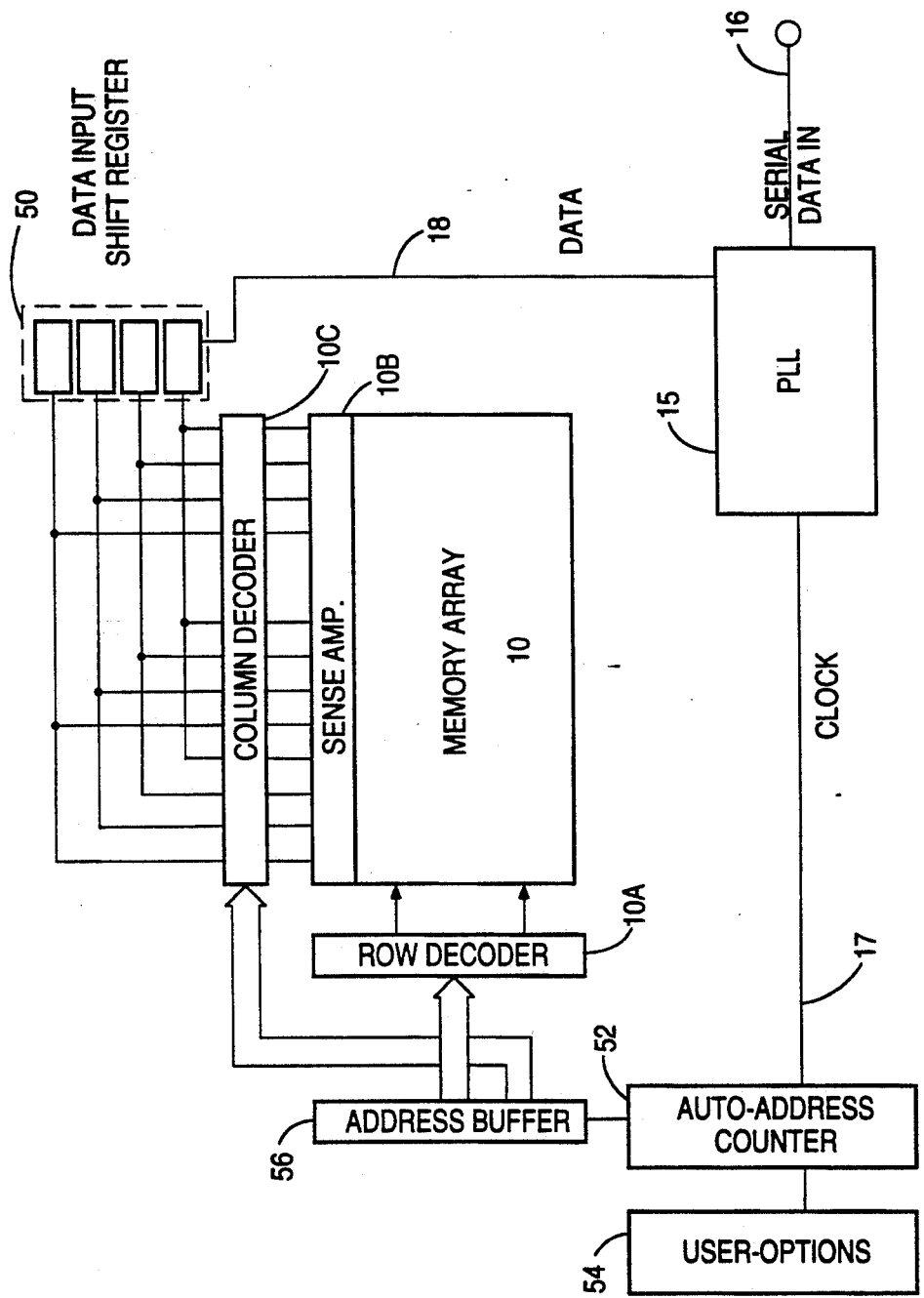
FIG. 3 is a block diagram illustrating a serial sequential circuit.

Referring next to FIG. 3, a circuit is shown that is illustrative of one embodiment of serial sequential circuit 20. The serial sequential circuit of FIG. 3 is shown connected to memory array 10 and to phase locked loop circuit 15. The phase locked loop circuit 15 provides data to a data input shift register 50 of the serial sequential circuit through data line 18. The clock line 17 is connected to an auto-address counter 52 that is controlled by a user option control 54. The serial sequential circuit 20 further includes an address buffer 56. The memory array 10 is further shown with row decoder 10A, sense amplifier 10B, and column decoder 10C. The serial sequential circuit of FIG. 2 is explained in more detail in the 1989 NEC Memory Products Databook, page 3-31, Artwork No. 83-004360C. This document is incorporated herein by reference.

It is noted that the random access port circuit 25 and the serial sequential circuit 20 as illustrated in FIGS. 2 and 3, respectively, may be embodied in a variety of different know configurations without departing from the spirit and scope of the invention. The specific embodiments of the serial sequential circuit and of the random access port circuit can be chosen by the circuit designer to satisfy the requirements of the particular application.

It is noted that in the preferred embodiment of the invention, the memory array 10, the phase locked loop circuit 15, the serial sequential circuit 20, and the random access port circuit 25 are all fabricated within a common integrated circuit chip. The integrated circuit may be directly connected to high speed storage devices and communication devices wherein unsynchronized raw serial data is provided for storage.

The invention advantageously eliminates complex serial input timing schemes associated with conventional video memory, while maintaining a high degree of efficiency and a low cost.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

I claim:
1. A memory circuit comprising;
 a memory array having a plurality of memory cells, an input bus, and an output bus;
 a serial sequential circuit coupled to said input bus of said memory array, said serial sequential circuit having a clock line and a data line, said serial sequential circuit adapted to receive synchronized serial data at said data line that is synchronized with a clock signal at said clock line, and including means for providing data to predetermined ones of sad plurality of memory cells;
 a phase locked loop circuit coupled to said serial sequential circuit for receiving unsynchronized serial data at a raw serial data line and generating said clock signal, and for providing said synchronized serial data to said data line of sad serial sequential circuit; and
 a random access port circuit having an address port and a parallel data port, said random access port circuit coupled to said memory array for providing data stored in selected ones of said memory cells of said memory array to said parallel data port in response to an addressing signal at said address port.

2. The memory circuit as recited in claim 1 wherein said sequential circuit includes a shift register.

3. The memory circuit as recited in claim 1 wherein said serial sequential circuit includes a counter for automatically addressing said memory array.

4. A memory circuit comprising:
 a memory array having a plurality of memory cells, an input bus, and an output bus;
 a serial sequential circuit coupled to said input bus of said memory array, wherein said serial sequential circuit includes a clock line and a data line, and wherein said serial sequential circuit is adapted to receive synchronized serial data at said data line that is phase synchronized with a clock signal at said clock line, and wherein said serial sequential circuit is adapted to provide data to predetermined ones of said plurality of memory cells;
 a phase locked loop circuit coupled to said serial sequential circuit, wherein said phase locked loop circuit receives unsynchronized serial data at a raw serial data line and generates said clock signal such that said clock signal is phase synchronized with said unsynchronized serial data; and
 a random access port circuit having an address port and a parallel data port, said random access port circuit coupled to said memory array for providing data stored in selected ones of said memory cells of said memory array to sad parallel data port in accordance with an addressing signal at said address port.

5. The memory circuit as recited in claim 4 wherein said serial sequential circuit includes a shift register coupled to receive said synchronized serial data at said data line.

* * * * *